United States Patent
Furukawa

(10) Patent No.: US 8,536,887 B2
(45) Date of Patent: Sep. 17, 2013

(54) PROBE CIRCUIT, MULTI-PROBE CIRCUIT, TEST APPARATUS, AND ELECTRIC DEVICE

(75) Inventor: Yasuo Furukawa, Saitama (JP)

(73) Assignee: Advantest Corporation, Tokyo (JP)

( * ) Notice: Subject to any disclaimer, the term of this patent is extended or adjusted under 35 U.S.C. 154(b) by 399 days.

(21) Appl. No.: 12/830,938

(22) Filed: Jul. 6, 2010

(65) Prior Publication Data

US 2011/0062977 A1  Mar. 17, 2011

Related U.S. Application Data

(63) Continuation of application No. PCT/JP2009/004660, filed on Sep. 16, 2009.

(51) Int. Cl.
G01R 31/3187 (2006.01)

(52) U.S. Cl.
USPC ............ 324/750.3; 324/762.01; 702/83; 702/117

(58) Field of Classification Search
USPC .................................... 702/83, 120
See application file for complete search history.

(56) References Cited

U.S. PATENT DOCUMENTS

| | | | |
|---|---|---|---|
| 6,373,393 B1 * | 4/2002 | Matsukuma et al. | 340/578 |
| 7,400,160 B2 * | 7/2008 | Hokoiwa et al. | 324/750.3 |
| 7,973,549 B2 * | 7/2011 | Joshi et al. | 324/762.01 |
| 8,432,181 B2 * | 4/2013 | Chiadambaram | 324/762.03 |
| 2004/0153801 A1 | 8/2004 | Kayukawa et al. | |
| 2008/0201063 A1 * | 8/2008 | Reuss et al. | 701/103 |

FOREIGN PATENT DOCUMENTS

| | | | |
|---|---|---|---|
| JP | 6-317620 A | 11/1994 | |
| JP | 7-020204 A | 1/1995 | |
| JP | 9-270714 A | 10/1997 | |
| JP | 2004-028696 | * 1/2004 | ............ 31/316 |
| JP | 2004-028696 A | 1/2004 | |
| JP | 2004-117029 A | 4/2004 | |

OTHER PUBLICATIONS

Written Opinion (PCT/ISA/237) issued in PCT/JP2009/004660 mailed in Dec. 2009.

Nagata, "On-Chip Measurements Complementary to Design Flow for Integrity in SoCs", Proc. Design Automation Conference 2007, Jun. 2007. pp. 400-403.

International Search Report (ISR) issued in PCT/JP2009/004660 (parent application) mailed in Dec. 2009 for Examiner consideration.

* cited by examiner

*Primary Examiner* — Richard Isla Rodas

(57) ABSTRACT

A probe circuit is provided in an electronic device that includes a circuit which is under test and outputs a response signal corresponding to an input signal in synchronization with an operation clock. The probe circuit includes a sampling clock supplying section that outputs a sampling clock having a predetermined frequency, and a sampling section that outputs, outside the electronic device, a probe output signal of which frequency is lower than a frequency of the response signal and which corresponds to a sampling result obtained by sampling the response signal using the sampling clock. The response signal has a prescribed signal pattern repeated with a predetermined recurrence period, and the sampling clock supplying section outputs the sampling clock of which relative phase with respect to the signal pattern sequentially changes in each recurrence period.

19 Claims, 11 Drawing Sheets

PROBE CIRCUIT, MULTI-PROBE CIRCUIT, TEST APPARATUS, AND ELECTRIC DEVICE

BACKGROUND

1. Technical Field

The present invention relates to a probe circuit, a multi-probe circuit, a test apparatus and an electronic device.

2. Related Art

Operation of a circuit embedded in an electronic device such as LSI can be effectively learned through observation of a signal output by the circuit. However, when a frequency of the signal is high, a waveform of the signal is distorted by a probe or the like that contacts with an external signal node, and therefore, it is difficult to observe a timing of change in the signal alone directly. An electronic beam (EB) tester has been known as a means to observe operations including a timing of change in a signal of a circuit embedded in an electronic device.

For example, the applicant recognizes a related-art document: Makoto Nagata, "On-Chip Measurements Complementary to Design Flow for Integrity in SoCs," Proc. Design Automation Conference 2007, pp. 400-403, 2007.06.

SUMMARY

However, to observe an internal signal of a circuit under test by using external equipment such as the EB tester, investment in the external equipment is needed, and there is a disadvantage in that it takes a long time to complete the observation of the signal. Moreover, in order to observe a signal converted to a lower frequency inside the electronic device, an additional circuit of which size is large is required, and it increases the product cost of the electronic device.

Therefore, it is an object of an aspect of the innovations herein to provide a probe circuit, a multi-probe circuit, a test apparatus and an electronic device, which are capable of overcoming the above drawbacks accompanying the related art. The above and other objects can be achieved by combinations described in the claims. Moreover, dependent claims specify advantageous and exemplary combinations of the innovations herein.

A first aspect of the innovations may include a probe circuit provided in an electronic device including a circuit which is under test and outputs a response signal corresponding to an input signal in synchronization with an operation clock includes a sampling clock supplying section that outputs a sampling clock having a predetermined frequency, and a sampling section that outputs, outside the electronic device, a probe output signal of which frequency is lower than a frequency of the response signal and which corresponds to a sampling result obtained by sampling the response signal using the sampling clock, where the response signal has a prescribed signal pattern repeated with a predetermined recurrence period, and the sampling clock supplying section outputs the sampling clock of which relative phase with respect to the signal pattern sequentially changes in each recurrence period.

In this case, the relative phase that changes in each recurrence period may be smaller than a cycle of the operation clock.

The probe circuit may further include an edge-timing detecting section that detects edge timing at which a logical value of the probe output signal changes.

The edge-timing detecting section may include a plurality of flip-flops that are cascade-connected each other and latch the response signal with the sampling clock, and an exclusive-OR circuit that operates exclusive disjunction of signals output by two of the plurality of the flip-flops to generate an edge timing signal that indicates the edge timing.

The edge-timing detecting section may include more than two flip-flops that are cascade-connected each other and latch the response signal with the sampling clock, a selecting circuit that selects two of output signals output by the more than two flip-flops, and an exclusive-OR circuit that calculates exclusive disjunction of the selected output signals to generate an edge timing signal that indicates the edge timing.

Furthermore, the edge-timing detection section may include a control circuit that determines which output signal is selected by the selecting circuit depending on a number of pulses of the sampling clock included in the recurrence period.

The probe circuit may further include a counter circuit that outputs a temporal signal indicating a length of time elapsed since a prescribed reference time, and a storage section that stores a signal output by the counter circuit in accordance with the edge timing signal.

The probe circuit may further include an input signal sampling section that generates a probe input signal by sampling the input signal using the sampling clock and outputs the generated probe input signal outside the electronic device.

The probe circuit may further include an edge-timing detecting section that detects edge timing at which a logical value of the probe output signal changes.

A second aspect of the innovations may include a multi-probe circuit that includes a plurality of the probe circuits, each of the plurality of the probe circuits being supplied with a same reference clock that operates the sampling clock supplying section, and an edge-timing output section that outputs a logical disjunction signal of the edge timing signal detected by each of the plurality of the probe circuits.

In this case, the edge-timing output section may output the logical disjunction signal together with information indicating whether a rising edge or a trailing edge of the edge timing signal is detected by each of the plurality of the probe circuits.

The edge-timing output section may also output the logical disjunction signal together with information indicating which of the plurality of the probe circuits detects the edge timing signal.

The plurality of the probe circuits may be provided corresponding to a plurality of nodes in the circuit under test, and each of the plurality of the probe circuits samples the response signal output from the corresponding node.

A third aspect of the innovations may include a test apparatus equipped with a probe circuit and tests the electronic device may include an operation-clock generating section that supplies the operation clock to the circuit under test, and a reference-clock generating section that generates a reference clock for the sampling clock based on the operation clock, and the reference-clock generating section supplying the generated operation clock to the sampling clock supplying section.

In the test apparatus, the probe circuit may further includes an input signal sampling section that generates a probe input signal by sampling the input signal using the sampling clock and outputs the probe input signal outside the electronic device, and the test apparatus may further includes a timing difference calculating section that measures a timing difference between an edge timing of the probe output signal and an edge timing of the probe input signal based on the probe output signal and the probe input signal.

The probe output signal sampled at each pulse of the sampling clock may be arranged in a prescribed sequence and compared with a predetermined signal pattern.

In the test apparatus, the electronic device may include a plurality of the probe circuits, each of the plurality of the probe circuits further including an edge-timing signal generating section that generates an edge-timing signal corresponding to an edge timing at which a logical value of the probe output signal changes; and an edge-timing output section that outputs the edge timing signal together with information indicating which of the plurality of the probe circuits generates the edge timing signal each of which is generated by one of the plurality of the probe circuits, where which of the plurality of the probe circuits generates the edge-timing signal is determined based on the information output together with the edge timing signal.

A fourth aspect of the innovations may include an electronic device including a circuit that is under test and outputs a response signal corresponding to an input signal in synchronization with an operation clock, and a probe circuit that includes a sampling clock supplying section that outputs a sampling clock having a predetermined frequency and a sampling section that outputs, outside the electronic device, a probe output signal of which frequency is lower than a frequency of the response signal and which corresponds to a sampling result obtained by sampling the response signal using the sampling clock, where the response signal has a prescribed signal pattern repeated with a predetermined recurrence period, and the sampling clock supplying section outputs the sampling clock of which relative phase with respect to the signal pattern sequentially changes in each recurrence period.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
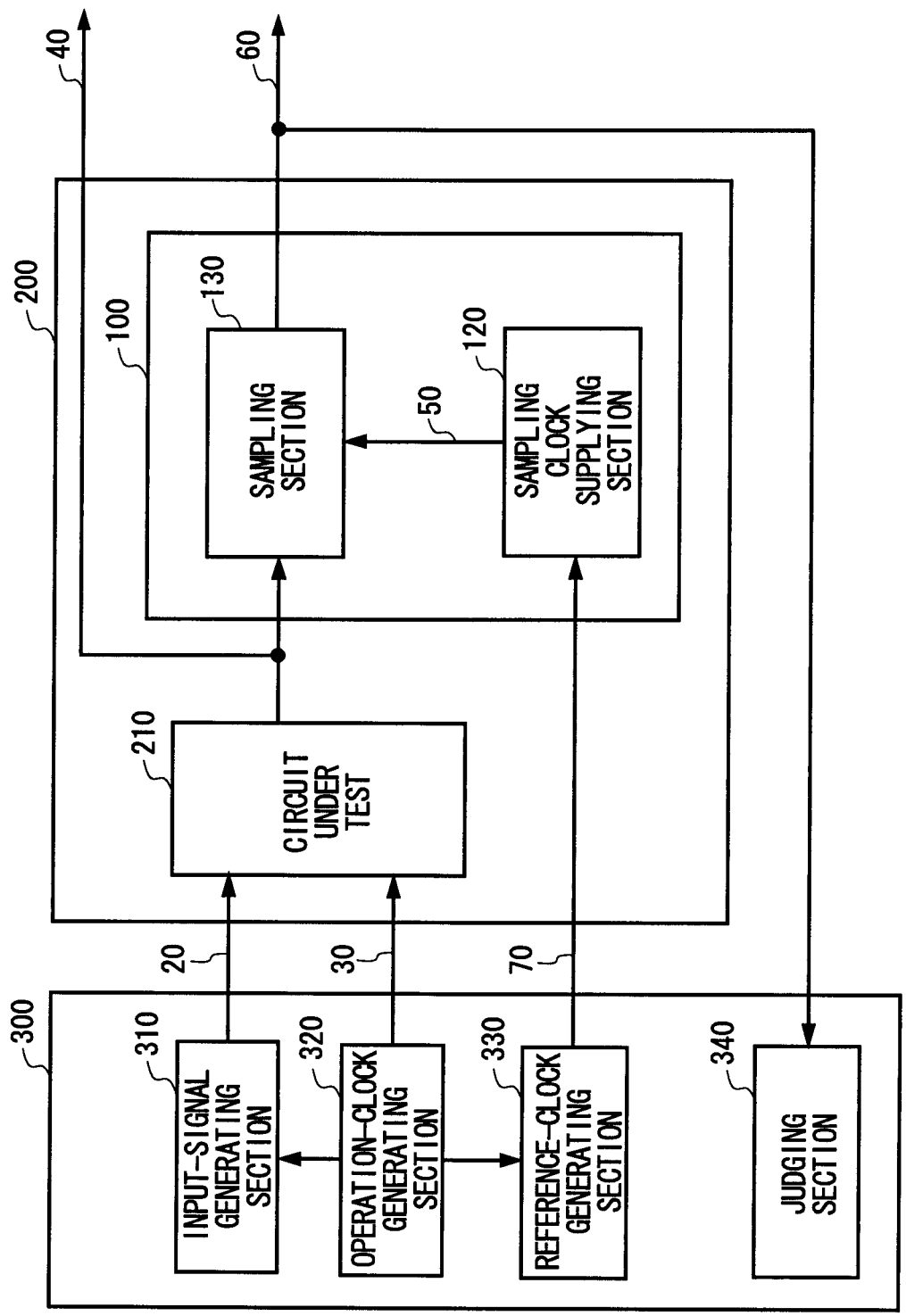
FIG. 1 shows a configuration of an electronic device 200 and a test apparatus 300 according to an embodiment of the invention.

FIG. 1 shows a configuration of an electronic device 200 and a test apparatus 300 according to an embodiment of the invention. Referring to FIG. 1, the electronic device 200 includes a probe circuit 100 and a circuit under test 210. The probe circuit 100 has a sampling clock supplying section 120 and a sampling section 130. The circuit under test 210 outputs a response signal 40 which corresponds to an input signal 20 in synchronization with an operation clock 30. The circuit under test 210 may output the response signal 40 outside the electronic device 200.

The input signal 20 has a signal pattern in which a prescribed signal pattern is replicated with a predetermined recurrence period. Here, the recurrence period is a time interval at which the same signal pattern recurs. For example, the input signal may be a signal pattern including a pseudorandom code in which data varies with a prescribed pattern at each predetermined data length. In this description, a position of a k-th (k is an integer) data counted from a start position of a signal pattern and included in the signal pattern is referred to as "k-th data position."

The test apparatus 300 includes an input-signal generating section 310, an operation-clock generating section 320, a reference-clock generating section 330 and a judging section 340. The test apparatus 300 tests the circuit under test 210. Specifically, the test apparatus 300 inputs the input signal 20 and the operation clock 30 into the circuit under test 210 which is under test, and the apparatus determines whether the circuit under test 210 is acceptable or not based on a signal output by the circuit under test 210 in response to the input signal 20.

The operation-clock generating section 320 supplies the circuit under test 210 with an operation clock that gives timing for the circuit under test 210 to operate. The reference-clock generating section 330 generates a reference clock 70 that gives timing based on which the sampling clock 50 works, and the sampling clock supplying section 120 supplies the sampling clock 50 to the sampling section 130. The reference-clock generating section 330 may employ a phase-locked loop circuit to generate the reference clock 70 synchronized with the operation clock 30 which is output by the operation-clock generating section 320.

The circuit under test 210 outputs the response signal 40 having a prescribed signal pattern repeated with a predetermined recurrence period according to the input signal 20. The circuit under test 210 may generate the response signal 40 by latching the input signal 20 with the operation clock 30.

The sampling clock supplying section 120 outputs the sampling clock 50 of which frequency is set lower than the frequency of the operation clock 30, and a relative phase of the sampling clock 50 with respect to the signal pattern of the response signal 40 sequentially varies in each recurrence cycle of the response signal 40. Specifically, the sampling clock supplying section 120 outputs the sampling clock 50 of which edge timing phase changes in every recurrence period by each prescribed value with respect to a phase at a beginning of each signal pattern of the response signal 40.

For example, the sampling clock supplying section 120 generates the sampling clock 50 including a pulse that rises simultaneously as a start of a first signal pattern of the response signal 40. Subsequently, the sampling clock supplying section 120 may output the sampling clock 50 in which rising edges occur at timings that are delayed by 10 ps and 20 ps respectively from the beginning of a second signal pattern and the beginning of a third signal pattern of the response signal 40.

The sampling clock supplying section 120 may generate the sampling clock 50 based on the reference clock 70 input from the reference-clock generating section 330. The sampling clock supplying section 120 may shape the reference clock 70 input from the reference-clock generating section 330 and then supply the shaped clock signal to the sampling section 130 as the sampling clock 50. The sampling clock supplying section 120 may generate the sampling clock 50 by frequency-dividing the reference clock 70.

The sampling section 130 samples the response signal 40 output by the circuit under test 210 using the sampling clock 50. When a relative phase of the sampling clock 50 with respect to a recurrence pattern of the response signal 40 is sequentially changed, a sampling position sampled by the sampling section 130 in the recurrence pattern of the response signal 40 also sequentially changes. The sampling section 130 performs sampling using the sampling clock 50 over more than one recurrence cycle of the response signal 40 so that it can sequentially sample the response signal 40 at different data positions in the signal pattern of the response signal 40. Consequently, the sampling section 130 performs sampling using the clock in which the relative phase shifts with each recurrence period, and thereby it can sample the signal pattern in a time resolution that corresponds to the shifted amount.

The sampling section 130 outputs, outside the electronic device 200, a probe output signal 60 generated through sampling. The sampling section 130 can output waveform information of the response signal 40 in the form of the probe output signal 60 of which frequency is lower than the frequency of the response signal 40 because the sampling section 130 uses the sampling clock 50 of which frequency is lower than that of the response signal 40. The test apparatus 300 may obtain the probe output signal 60. The judging section 340 may output a test result in accordance with timing at which the probe output signal 60 changes.

For example, the judging section 340 may compare an expected value of a prescribed signal pattern with a pattern of the probe output signal 60. The judging section 340 may judge the electronic device 200 as an acceptable product when the comparison finds these signal patterns identical, whereas the judging section 340 may judge the electronic device 200 as a defective product when the comparison finds these signal patterns not identical. The judging section 340 may generate a waveform in accordance with the obtained signal pattern of the probe output signal 60 and may display the waveform.

The smaller the shift amount of the relative phase is in each recurrence cycle, the higher the time resolution of sampling performed by the sampling section 130 becomes. Preferably, the sampling clock supplying section 120 supplies, to the sampling section 130, the sampling clock 50 in which the relative phase varying in every recurrence cycle is smaller than a period of the operation clock 30. The sampling section 130 outputs, outside the electronic device 200, the probe output signal 60 of which frequency is lower than a frequency of the response signal 40, and the probe output signal 60 corresponds to the sampling result of the response signal 40 performed by using the sampling clock 50.

As described above, the probe circuit 100 can show a logical value corresponding to a signal pattern of the response signal 40, and can output the probe output signal 60 of which frequency is lower than the frequency of the response signal 40 outside the electronic device 200. Consequently, testing will not suffer from the drawbacks such as waveform distortion caused by observing a high-frequency response signal 40 directly. Therefore, it is possible for the test apparatus 300 and so forth to make observation to determine whether timing at which the response signal 40 varies is normal or not.

Figure 2:
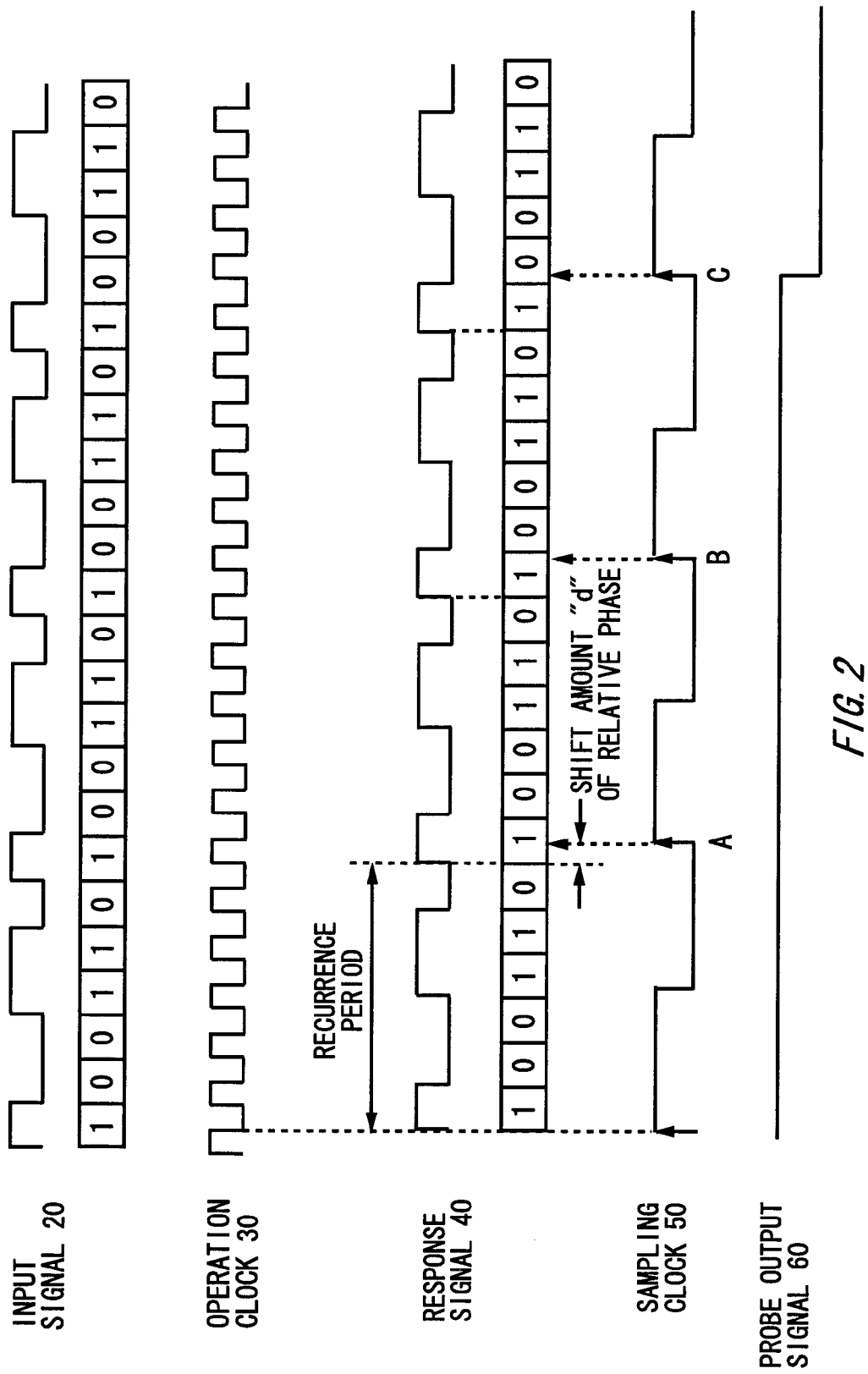
FIG. 2 shows an example of relations among an input signal 20, an operation clock 30, a response signal 40, a sampling clock 50 and a probe output signal 60.

FIG. 2 shows an example of relations among the input signal 20, the operation clock 30, the response signal 40, the sampling clock 50 and the probe output signal 60. The input-signal generating section 310 inputs, to the circuit under test 210, the input signal 20 having a 6-bit recurrence pattern "100110" in synchronization with a rising edge of the operation clock 30. The circuit under test 210 outputs the response signal 40 that is generated by latching the input signal 20 at a trailing edge of the operation clock 30. For example, when a unit interval (UI) of the response signal 40 is 100 ps, the recurrence period of the response signal 40 is 600 ps. The probe circuit 100 outputs the probe output signal 60 that varies according to a shift of the response signal 40 from a first data position to a second data position at a rising edge C of the sampling clock 50.

The sampling clock supplying section 120 outputs the sampling clock 50 that rises in synchronization with a start position of a first data (a phase at this position is set as zero) of the signal pattern of the response signal 40. In this example, the period of the sampling clock 50 is longer than the recurrence period of the response signal 40.

Figure 3:
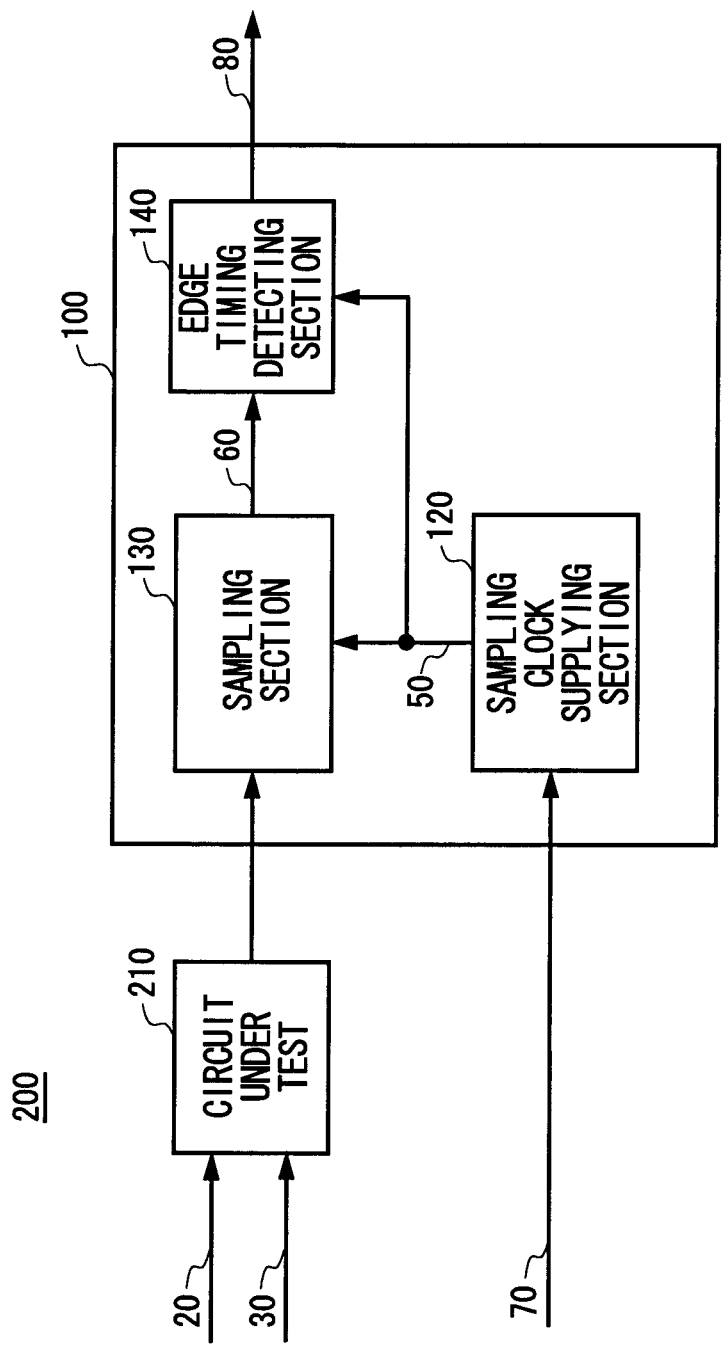
FIG. 3 shows a configuration of the electronic device 200 according to another embodiment of the invention.

FIG. 3 shows a configuration of the electronic device 200 according to another embodiment of the invention. Timing at which the response signal 40 changes can be calculated from a timing at which the probe output signal 60 changes and a shift amount "d" of the relative phase. For example, when a logical value of the probe output signal 60 changes at a N-th recurrence period, the timing at which a shift of the response signal 40 occurs between "(N−1)×d" and "N×d" To detect the timing when the probe output signal 60 varies, the probe circuit 100 shown in FIG. 3 further includes an edge-timing detecting section 140, which is not included in the probe circuit 100 shown in FIG. 1. The edge-timing detecting section 140 detects an edge timing at which the logical value of the probe output signal 60 changes. The edge-timing detecting section 140 may output a detected edge timing signal 80 outside the electronic device 200.

Figure 4:
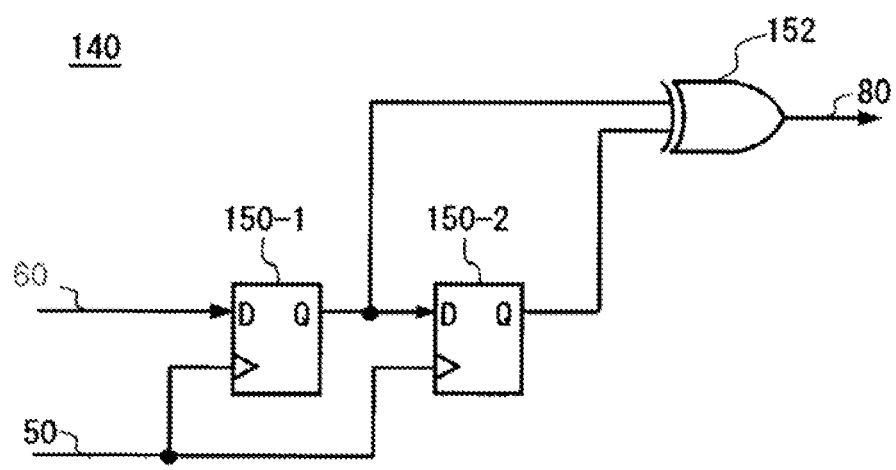
FIG. 4 shows a configuration example of an edge-timing detecting section 140.

FIG. 4 shows a configuration example of the edge-timing detecting section 140. The edge-timing detecting section 140 has a plurality of flip-flops 150 (150-1, 150-2) that are cascade-connected each other and latch the probe output signal 60 using the sampling clock 50. The edge-timing detecting, section 140 further includes an exclusive-OR circuit 152 that operates exclusive disjunction of the signals output by the plurality of the flip-flops 150 in order to generate an edge timing signal that indicates edge timing.

The flip-flop 150-1 outputs a value of the probe output signal 60 which is sampled by using the sampling clock 50. The flip-flop 150-2 outputs a value of the probe output signal 60 which is sampled in a previous cycle of the sampling clock 50 with respect to the cycle in which the flip-flop 150-1 performs sampling.

When a logical value of the probe output signal 60 is not changed compared to a logical value in the previous period of the sampling clock 50, the logical values output by the flip-flop 150-1 and the flip-flop 150-2 become identical so that "0" is output by the exclusive-OR circuit 152. Whereas when the logical value of the probe output signal 60 is changed compared to the logical value in the previous period of the sampling clock 50, the logical values output by the flip-flop 150-1 and the flip-flop 150-2 are not identical so that "1" is output by the exclusive-OR circuit 152.

The test apparatus 300 may obtain the output signal of the exclusive-OR circuit 152. The test apparatus 300 may determine that a logical value of the data of the response signal 40 is changed at the timing when the output signal is shifted to "1". The judging section 340 may judge if the electronic device 200 is acceptable based on whether this timing falls within a predetermined range of timing.

Figure 5:
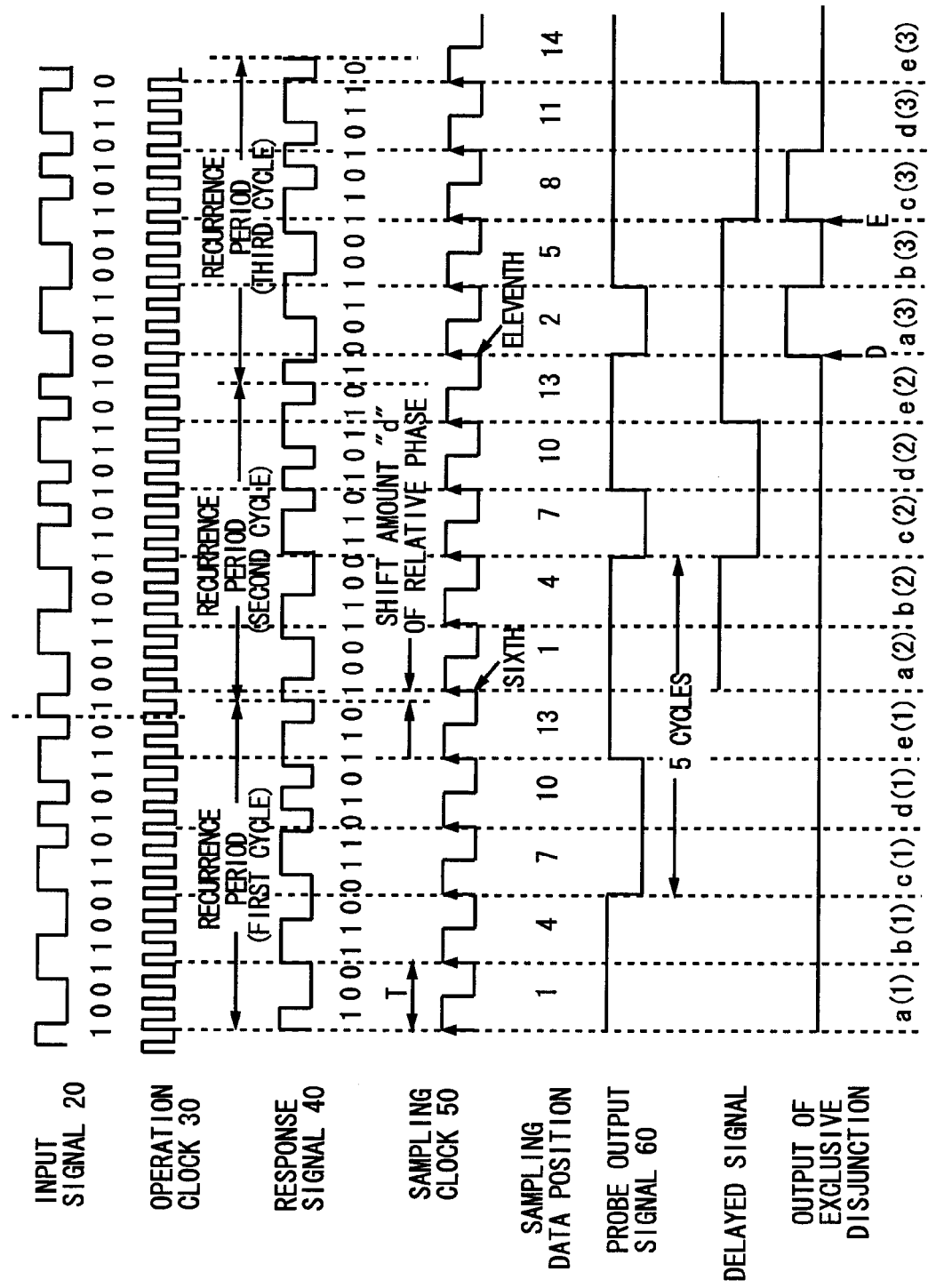
FIG. 5 shows another example of the relations among the input signal 20, the operation clock 30, the response signal 40, the sampling clock 50 and the probe output signal 60.

FIG. 5 shows another example of the relations among the input signal 20, the operation clock 30, the response signal 40, the sampling clock 50 and the probe output signal 60. In this embodiment, the response signal 40 includes a signal pattern which is repeated and has 15 bit length. Furthermore, one recurrence cycle of the response signal 40 includes a plurality of cycles of the sampling clock 50 of which period is T.

Specifically, the recurrence period of the response signal 40 is longer than a time interval corresponding to "m" cycles of the sampling clock 50 and shorter than a time interval corresponding to "m+1" cycles of the sampling clock 50, where "m" is an integer larger than 1. FIG. 5 illustrates an example where m=4, a recurrence period of the response signal 40 is 1500 ps (15×100 ps) and the period of the sampling clock 50 is 315 ps. The sampling section 130 samples the response signal 40 every 315 ps.

Here, a phase of the sixth rising edge of the sampling clock 50 is (315 ps×5=) 1575 ps. Because the recurrence period of the response signal 40 is 1500 ps, the sixth rising edge of the sampling clock 50 is included in the second recurrence cycle of the response signal 40. Furthermore, a unit data length of the response signal 40 is 100 ps so that the sampling section 130 samples the first data of the response signal 40 in the second recurrence cycle of the response signal 40 at the sampling phase of 1575 ps.

A phase of the eleventh rising edge of the sampling clock 50 is (315×10=) 3150 ps. Two recurrence cycles combined of the response signal 40 has a time length of 3000 ps and the unit data length is 100 ps. Accordingly, at the sampling phase, the sampling section 130 samples the second data of the response signal 40 in the second recurrence cycle.

In other words, the probe output signal 60 at the sixth rising edge of the sampling clock 50 shows a logical value of the first data of the response signal 40. The probe output signal 60 at the eleventh rising edge of the sampling clock 50 shows the logical value of the second data of the response signal 40. Accordingly, the logic value of the probe output signal 60 is "1" at the sixth rising edge of the sampling clock 50, and a timing where the logical value of the probe output signal 60 changes from "1" to "0" at the eleventh rising edge of the sampling clock 50 corresponds to the timing where data of the response signal 40 is shifted from the first data to the second data.

Here, consecutive regions each of which is situated between the adjacent two rising edges of the sampling clock 50 are sequentially labeled as a, b, c, d and e. When the shift amount of the relative phase is denoted as "d" and detection is performed in a region "a" in a k-th recurrence period which is denoted as a region a(k), the edge-timing detecting section 140 detects a data transition timing of the response signal 40 that occurs between d×(k−2) and d×(k−1) in the region a(k) through the probe output signal 60.

For example, the edge-timing detecting section 140 detects timing of data transition from the first data to the second data in the response signal 40 at the timing D in the region a(3). The edge-timing detecting section 140 also detects a timing of shift from the seventh data to the eighth data in the response signal 40 at the timing E in the region c(3).

Moreover, a delayed signal is generated by delaying the probe output signal 60 only by a time duration corresponding to five cycles of the sampling clock 50, for example, and the edge-timing detecting section 140 detects a data transition timing by calculating exclusive disjunction of the probe output signal 60 and the generated delayed signal.

Figure 6:
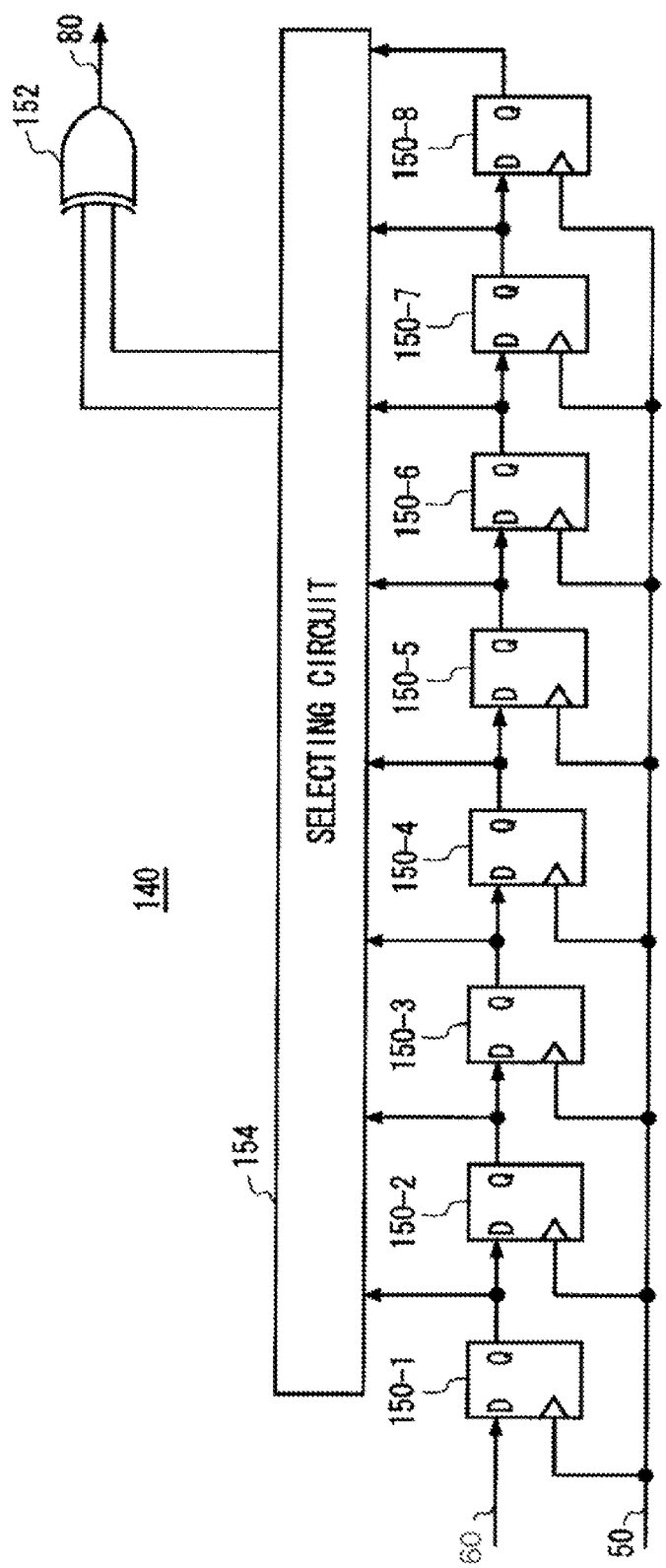
FIG. 6 shows another configuration example of the edge-timing detecting section 140.

FIG. 6 shows another configuration example of the edge-timing detecting section 140. In this embodiment, the edge-timing detecting section 140 includes more than two flip-flops 150 (150-1 to 150-8) cascade-connected each other that latch the response signal 40 using the sampling clock 50. The edge-timing detecting section 140 further includes a selecting circuit 154 that selects two output signals among the signals output by the more than two flip-flops, and an exclusive-OR circuit 152 that operates exclusive-OR of the output signals selected by the selecting circuit 154 to generate an edge timing signal that indicates edge timings.

For the previous example, the edge-timing detecting section 140 can detect the data transition timing of the response signal 40 by detecting a change of a logic value of the probe output signal 60 with respect to the logic value behind by five cycles of the sampling clock 50. For this reason, the selecting circuit 154 selects an output signal of the flip-flop 150-1 and an output signal of the flip-flop 150-6 to input them into the exclusive-OR circuit 152.

FIG. 6 shows another configuration example of the edge-timing detecting section 140. In this embodiment, the edge-timing detecting section 140 includes more than two flip-flops 150 (150-1 to 150-8) cascade-connected each other that latch the probe output signal 60 using the sampling clock 50. The edge-timing detecting section 140 further includes a selecting circuit 154 that selects two output signals among the signals output by the more than two flip-flops, and an exclusive-OR circuit 152 that operates exclusive-OR of the output signals selected by the selecting circuit 154 to generate an edge timing signal that indicates edge timings.

The edge-timing detecting section 140 may switch outputs of the selected flip-flops 150 depending on a relation between the recurrence period of the response signal 40 and the period of the sampling clock 50. Specifically, the edge-timing detecting section 140 may further include a control circuit that determines the output signals selected by the selecting circuit 154 depending on the number of pulses of the sampling clock 50 generated in the recurrence period.

More specifically, when the number of pulses of the sampling clock 50 generated in the recurrence period of the response signal 40 is "n" (where "n" is an integer), the edge-timing detecting section 140 may select an output of the flip-flop 150-1 and an output of the flip-flop 150-(n+2) which is the same output but delayed by (n+1) cycles of the sampling clock 50. The number of the pulses can be calculated from the equation "n=[R/T]+1", where "R" is the recurrence period and "T" is the period of the sampling clock 50. Here, [x] represents the maximum integer that does not exceed "x".

Figure 7:
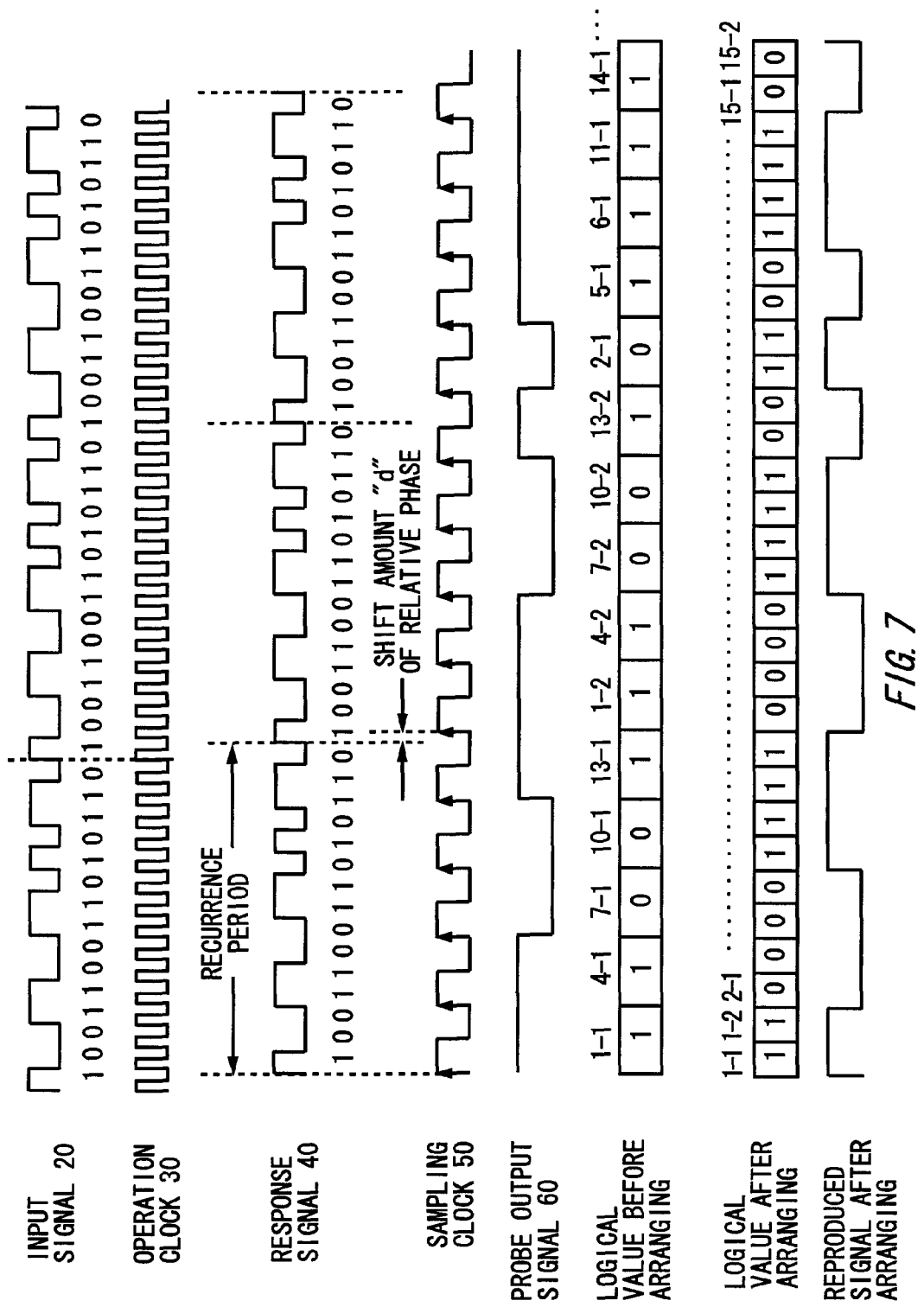
FIG. 7 shows another example of the relations among the input signal 20, the operation clock 30, the response signal 40, the sampling clock 50 and the probe output signal 60.

FIG. 7 shows another example of the relations among the input signal 20, the operation clock 30, the response signal 40, the sampling clock 50 and the probe output signal 60. The test apparatus 300 may judge whether the electronic device 200 is acceptable by arranging the sampled probe output signals 60 sampled at each pulse of the sampling clock 50 in a prescribed sequence, and then comparing it with a predetermined signal pattern.

The sampling section 130 samples the response signal 40 at each rising edge of the sampling clock 50 that is generated at the same timing of the sampling clock 50 shown in FIG. 5. In other words, the sampling section 130 samples the response signal 40 at the timings of the first, fourth and seventh data of the response signal 40 in this order to generate the probe output signal 60. Referring to FIG. 7, the label "i-j" in the "logical value before arranging" denotes the j-th data sampled in the i-th data position.

The data transition timing included in the probe output signal 60 only shows, for example, a logical value change between the first data and the forth data of the response signal 40. Therefore, the test apparatus 300 cannot obtain shift timing between two adjacent data of the response signal 40 directly from the data transition timing included in the probe output signal 60.

To make it possible, the test apparatus 300 may store the probe output signal 60 in a memory or the like, and may then arrange the sequence of sampled data sampled by using the sampling clock 50 so as to detect data-shift timing between two consecutive data of the response signal 40. Specifically, the test apparatus 300 stores logical values of the probe output signal 60 which keeps being output over a plurality of the recurrence cycles of the response signal 40 in association with data positions at which samplings of the response signal 40 are performed. The test apparatus 300 may further store time information that indicates timings at which samplings are performed in association with the sampling data positions.

For example, the test apparatus 300 stores the logical value of the probe output signal 60 at each sampling timing in a storage medium such as a memory in association with the corresponding sampled data position of the response signal 40 and a shift amount of a relative phase. The test apparatus 300 subsequently reads the stored logic values of the probe output signal 60 in an order corresponding to the sequence of the data positions of the response signal 40. As for the data situated in the same data position, the test apparatus 300 reads them in the order of the shift amount of the relative phase. As a result, the test apparatus 300 can reproduce the same signal pattern as that of the response signal 40 but with a lower frequency than that of the response signal 40, which is shown in the "logical values after arrangement" in FIG. 7 as "110000111100001111001100111100" which is arranged in the order of the data positions of the response signal 40.

The test apparatus 300 may compare the reproduced signal pattern to a pattern of expected values of the response signal 40. When these patterns are found identical each other after the comparison, the test apparatus 300 may determine that the electronic device 200 is acceptable. When the patterns are not identical, the test apparatus 300 may determine that the electronic device 200 is not acceptable.

Alternatively, the probe circuit 100 may arrange the probe output signal 60 sampled at each of the pulses of the sampling clock 50 in advance to a prescribed order. In this case, the electronic device 200 can output a signal that has a lower frequency than that of the response signal 40 and that varies according to a signal pattern of the response signal 40.

Figure 8:
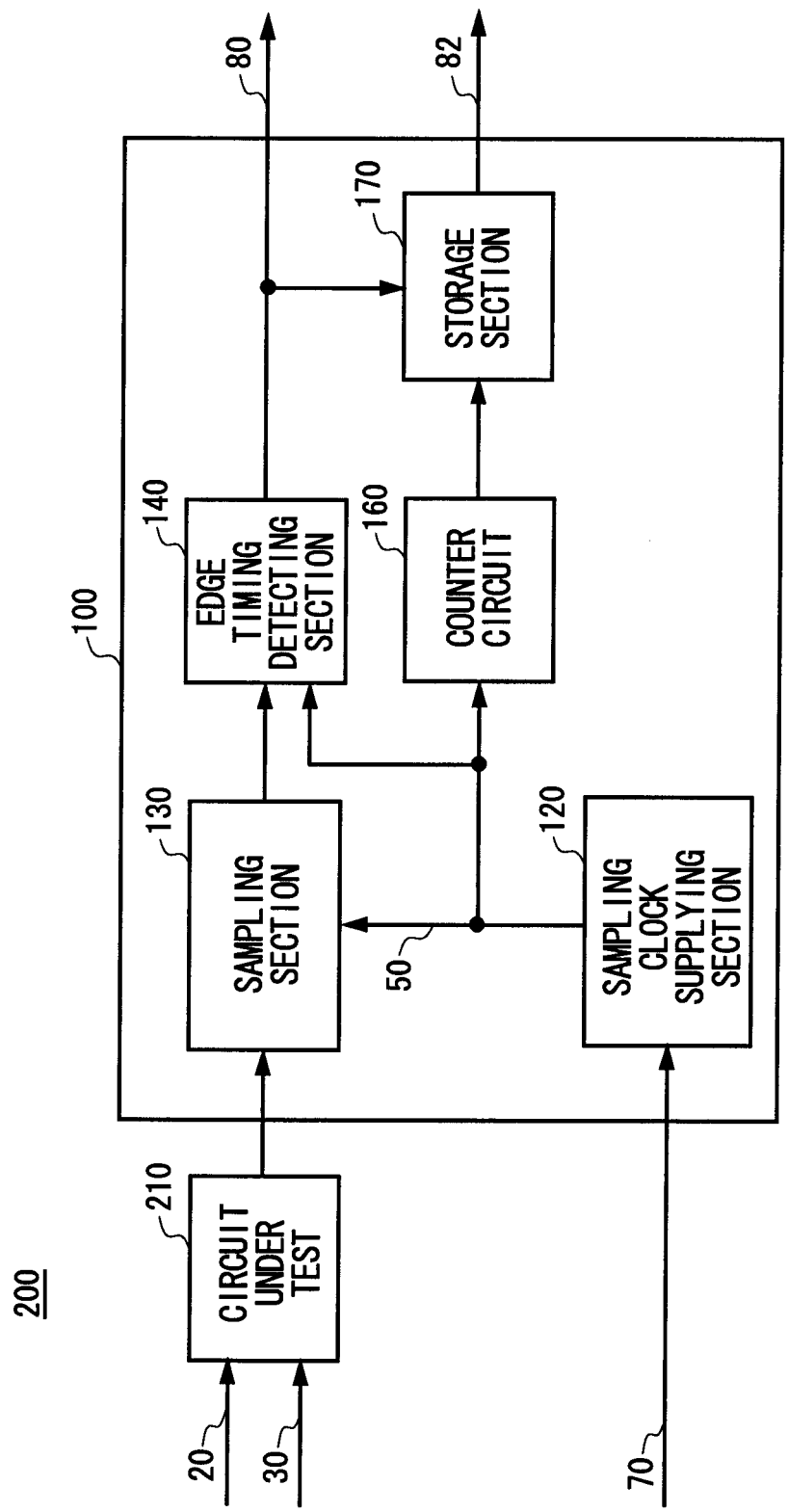
FIG. 8 shows a configuration of the electronic device 200 according to another embodiment of the invention.

FIG. 8 shows a configuration of the electronic device 200 according to another embodiment. The probe circuit 100 of the embodiment further includes a counter circuit 160 and a storage section 170 which are not included in the probe circuit 100 shown in FIG. 3. The counter circuit 160 outputs a temporal signal that indicates a length of time elapsed since a prescribed reference time. The counter circuit 160 may set, for example, a start timing of the first recurrence cycle of the response signal 40 as the reference time of the temporal signal. Moreover, the counter circuit 160 may be supplied with the sampling clock 50 from the sampling clock supplying section 120 and output a temporal signal in which a predetermined value is added to the prescribed reference time at every edge timing of the sampling clock 50.

For example, the counter circuit 160 may output binary data to which "1" is added at every edge timing of the sampling clock 50 as the temporal signal. Alternatively, the counter circuit 160 may output, as the temporal signal, a value to which an actual-time value that corresponds to cycles of the sampling clock 50 is added.

The storage section 170 stores the temporal signal that is output by the counter circuit 160 in accordance with the edge timing signal 80. The storage section 170 may latch the temporal signal at the timing of a rising edge or a trailing edge of the edge timing signal 80 and then stores the temporal signal into a memory at an address corresponding to a signal pattern of the response signal 40. The operation clock 30 includes a plurality of data (15 bits in this example) in the recurrence period. In this case, the storage section 170 may group memory addresses into the number of regions that correspond to the number of data (15 in this example) included in the recurrence period, and may store the temporal signal sequentially in addresses in the address regions corresponding to positions in the signal pattern of the response signal 40.

The storage section 170 may couple the test apparatus 300 to a bus interface signal 82 such as an address bus and a data bus. The test apparatus 300 may obtain temporal information that indicates a transition timing of the data by inputting, to the storage section 170, a signal which represents an address corresponding to a data position of the response signal 40. The test apparatus 300 may judge whether the electronic device 200 is acceptable by comparing the obtained temporal information with predetermined temporal information stored therein. The test apparatus 300 may determine that the electronic device 200 is acceptable when a difference between the obtained temporal information and the stored temporal information falls within a prescribed range.

Figure 9:
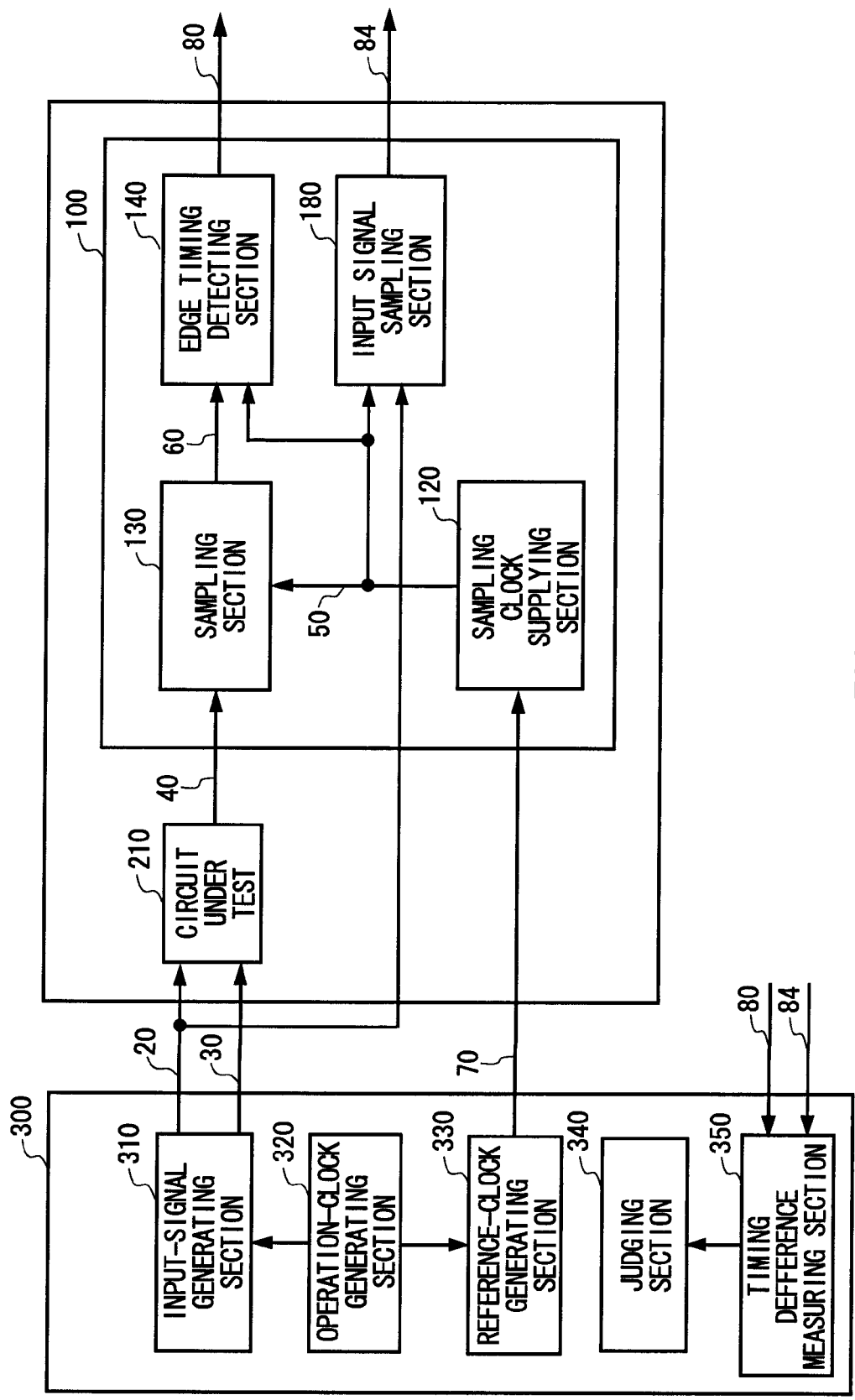
FIG. 9 shows a configuration of the electronic device 200 and the test apparatus 300 according to another embodiment of the invention.

FIG. 9 shows a configuration of the electronic device 200 and the test apparatus 300 according to another embodiment. The probe circuit 100 further includes an input signal sampling section 180, which are not included in the probe circuit 100 shown in FIG. 3. The input signal sampling section 180 generates a probe input signal 84 by sampling the input signal 20 using the sampling clock 50, and then outputs the generated input signal outside the electronic device 200. The input signal sampling section 180 may sample the input signal 20 using the sampling clock 50 which is also used by the sampling section 130. The input signal sampling section 180 may generate the probe input signal 84 in the same way as the sampling section 130 does.

The test apparatus 300 further has a timing difference measuring section 350, which is not included in the test apparatus 300 shown FIG. 1. The timing difference measuring section 350 measures a timing difference between an edge timing of the probe output signal 60 and an edge timing of the probe input signal 84 based on the probe output signal 60 and the probe input signal 84.

When a delay time of the response signal 40 with respect to the input signal 20 that is input into the circuit under test 210 falls within a certain range, a phase difference between the probe output signal 60 and the probe input signal 84 stays within a certain definite range. Therefore, the judging section 340 may determine that the electronic device 200 functions normally when the timing difference between the probe output signal 60 and the probe input signal 84 measured by the timing difference measuring section 350 is within a predetermined range.

The probe circuit 100 may further include a timing difference calculating section that outputs, outside the electronic device 200, information indicating a timing difference between an edge timing of the probe output signal 60 and an edge timing of the probe input signal 84. The probe circuit 100 may input the information of the timing difference into the test apparatus 300. In this case, even for the test apparatus 300 that does not have the timing difference measuring section 350, it is possible to judge acceptance of the electronic device 200 based on the timing difference between an edge timing of the probe output signal 60 and an edge timing of the probe input signal 84.

Figure 10:
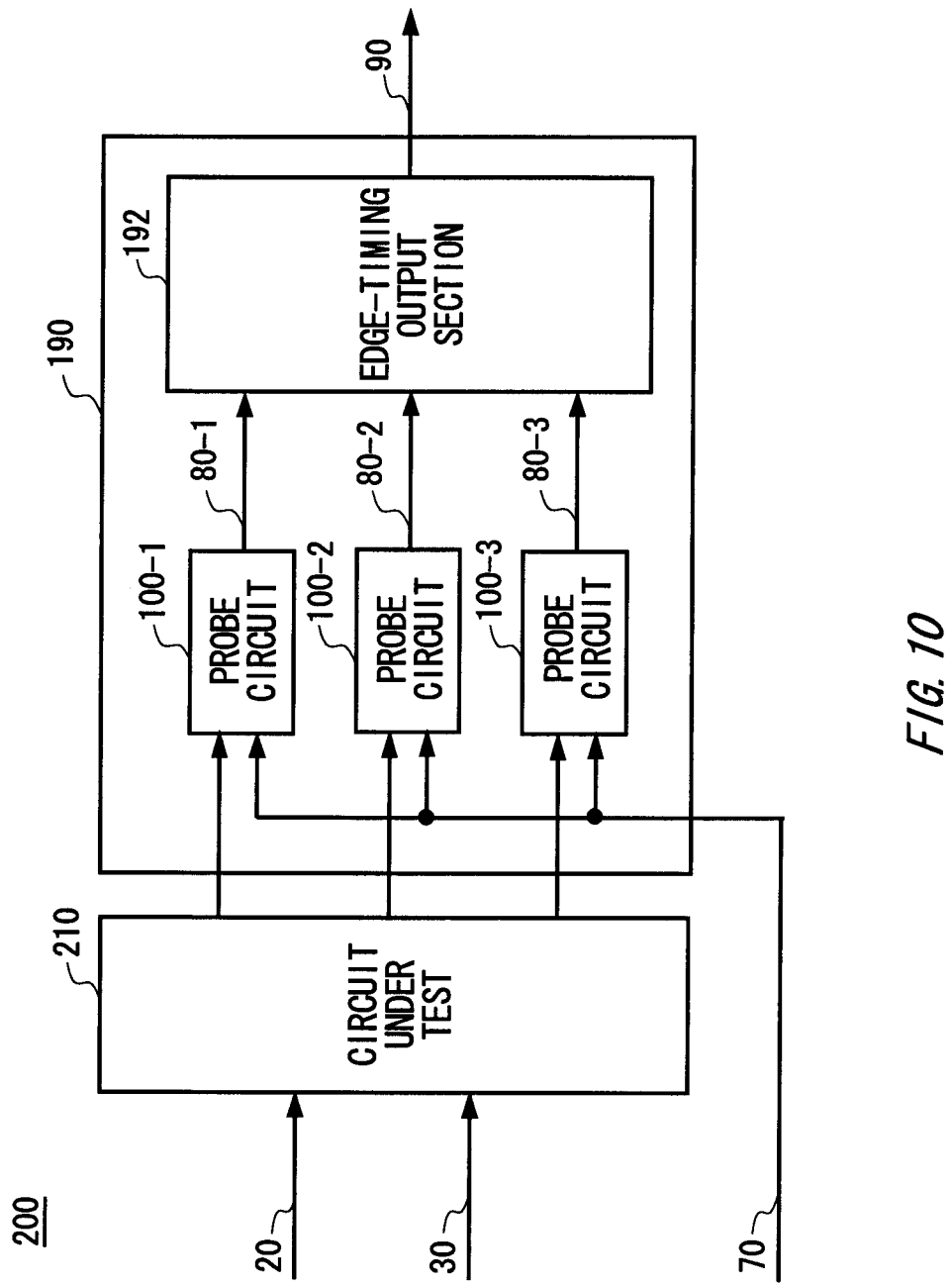
FIG. 10 shows a configuration of the electronic device 200 according to another embodiment of the invention.

FIG. 10 shows a configuration of the electronic device 200 according to another embodiment of the invention. The electronic device 200 shown in FIG. 10 has a multi-probe circuit 190 instead of the probe circuit 100 shown in FIG. 1. The multi-probe circuit 190 has a plurality of probe circuits 100 (a probe circuit 100-1, a probe circuit 100-2 and a probe circuit 100-3) and an edge-timing output section 192. The probe circuit 100-1, the probe circuit 100-2 and the probe circuit 100-3 may have the same configuration as that of the probe circuit 100 shown in FIG. 1.

The same reference clock 70 that operates the sampling clock supplying section 120 is input into each of the plurality of the probe circuit 100. The plurality of the probe circuits 100 is provided corresponding to a plurality of nodes in the circuit under test 210, and each of the plurality of the probe circuits 100 uses the sampling clock 50 to sample the response signal 40 output by the corresponding node. Each of the probe circuits 100 samples the response signal 40 to generate and output the probe output signal 60.

The edge-timing output section 192 outputs a logical disjunction signal 90 that indicates a logical disjunction of the edge timing signals 80 each of which is detected by each of the plurality of the probe circuits 100. The test apparatus 300 may obtain the logical disjunction signal 90. The test apparatus 300 may judge whether the electronic device 200 is acceptable based on a transition timing of the logical disjunction signal 90. For example, when any of the transition timings of the logical disjunction signal 90 is not in a predetermined range, the test apparatus 300 may judge that a failure occurs at a circuit corresponding to one or more of the nodes in the circuit under test 210 and may determine that the electronic device 200 is not acceptable.

When a shift amount of a relative phase is smaller than a timing difference of data transition of the response signal 40 between the nodes, the data transition timings at the node can be detected through the sampling clocks 50 that have different relative phases. Accordingly, the edge timing signals that are output by the plurality of the probe circuits 100 provided corresponding to the nodes become "1" at different timings.

Moreover, the edge timing signal 80 becomes "1" only at a transition point of the probe output signal 60, and therefore, there is a low possibility that the edge timing signals 80 generated by the plurality of the probe circuits 100 overlap each other as long as a shift amount of the relative phase is small. Consequently, data transition timing at each node can be known through the logical disjunction signal 90 of the edge timing signals 80 output by the plurality of the probe circuits 100. In this way, the number of signals coupled the test apparatus 300 and the electronic device 200 can be reduced by using the logical disjunction signal 90 of the edge timing signals 80 output by the plurality of the probe circuits 100.

The test apparatus 300 may obtain the logical disjunction signal 90 and edge-polarity information. The test apparatus 300 detects a logical value of the response signal 40 at transition timing based on the edge polarity information at the corresponding transition time of the logical disjunction signal 90. The test apparatus 300 may judge whether the electronic device 200 is acceptable by comparing a prescribed expected value and the detected logical value.

The edge-timing output section 192 may output the logical disjunction signal 90 together with information indicating which of the plurality of the probe circuits 100 detects the edge timing signal 80. For example, the edge-timing output section 192 may output, at timing when the logical disjunction signal 90 varies, probe-circuit identification information in which a bit-value corresponding to the identification number of the probe circuit 100 in which the edge timing signal 80 varies is set to "1."

The test apparatus 300 may obtain the logical disjunction signal 90 and the probe-circuit identification information. The test apparatus 300 may judge in which probe circuit 100 the edge timing signal 80 varies based on the probe-circuit identification information at the timing when the logical disjunction signal 90 varies. The test apparatus 300 may judge whether the electronic device 200 is acceptable by comparing the transition timing of the edge timing signal 80 in each probe circuit 100 with a prescribed expected value. When a value in a probe circuit 100 is found not identical to the expected value by the comparison, the test apparatus 300 may display that a failure occurs in the probe circuit 100.

Figure 11:
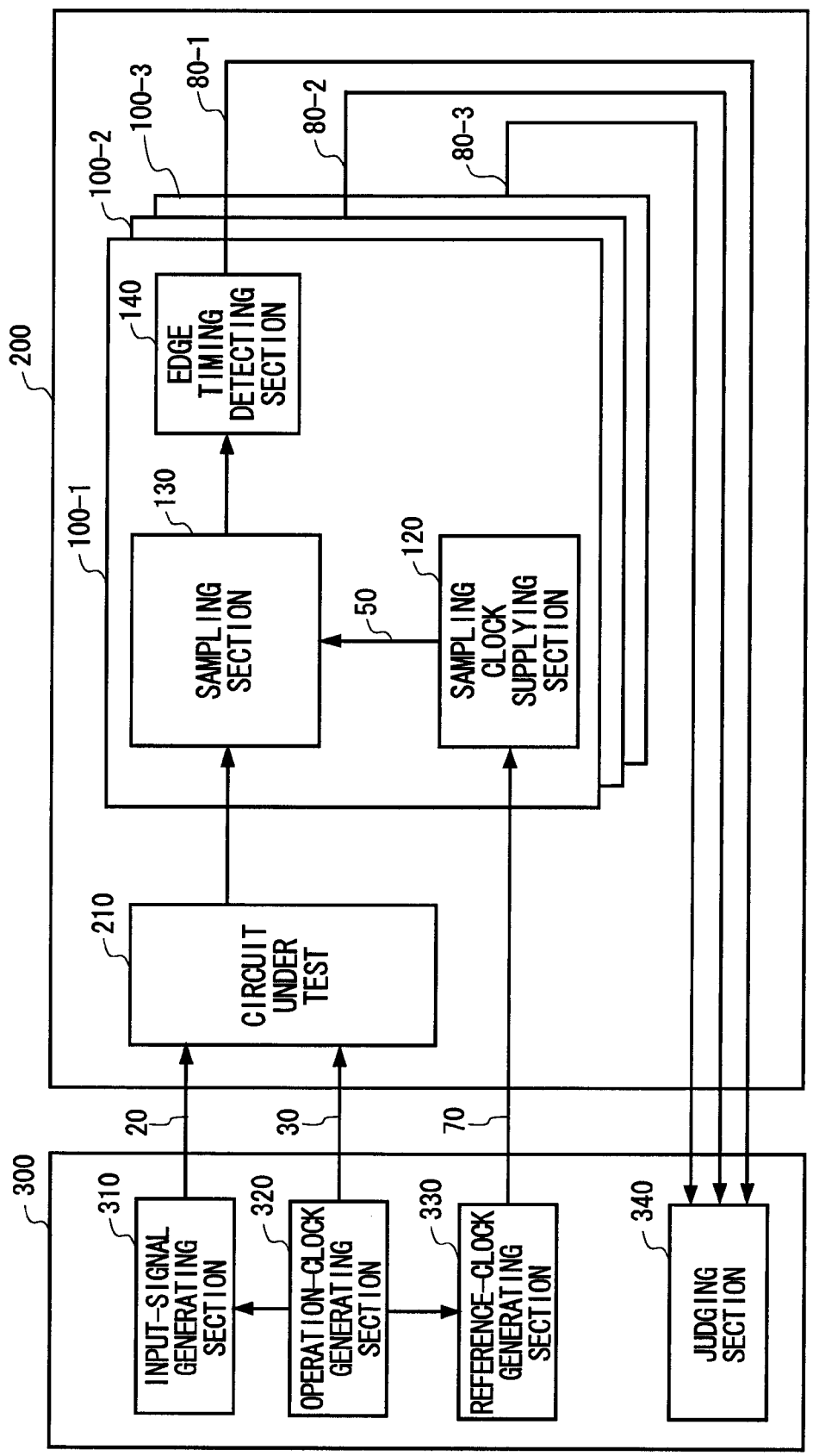
FIG. 11 shows a configuration of the electronic device 200 and the test apparatus 300 according to another embodiment of the invention.

FIG. 11 shows a configuration of the electronic device 200 and the test apparatus 300 according to another embodiment. The electronic device 200 includes the plurality of the probe circuits 100 (the probe circuit 100-1, the probe circuit 100-2 and the probe circuit 100-3). Each of the plurality of the probe circuits 100 has the sampling clock supplying section 120, the sampling section 130 and the edge-timing detecting section 140. The judging section 340 obtains the edge timing signal 80 output by each of the probe circuits 100. The judging section 340 may judge whether each of the probe circuits 100 is acceptable by any one of the above-described methods.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a probe circuit, a multi-probe circuit, a test apparatus and electronic device that observe operations such as a transition timing of a signal in a circuit provided inside the electronic device.

What is claimed is:

1. A probe circuit provided in an electronic device that includes a circuit which is under test and outputs a response signal corresponding to an input signal in synchronization with an operation clock, comprising:
a sampling clock supplying section that outputs a sampling clock having a predetermined frequency;
a sampling section that outputs, outside the electronic device, a probe output signal of which frequency is lower than a frequency of the response signal and which corresponds to a sampling result obtained by sampling the response signal using the sampling clock; and
an edge-timing detecting section that detects edge timing at which logical value of the probe output signal changes, wherein the response signal has a prescribed signal pattern repeated with a predetermined recurrence period, and
the sampling clock supplying section outputs the sampling clock of which relative phase with respect in the signal pattern sequentially changes in each recurrence period.

2. The probe circuit according to claim 1, wherein an amount by which the relative phase changes in each recurrence period is smaller than a cycle of the operation clock.

3. The probe circuit according to claim 1, wherein
the edge-timing detecting section includes:
a plurality of flip-flops that are cascade-connected to each other and latch the response signal with the sampling clock; and
an exclusive-OR circuit that operates exclusive disjunction of signals output by two of the plurality of the flip-flops to generate an edge timing signal that indicates the edge timing.

4. The probe circuit according to claim 3, further comprising:
an input signal sampling section that generates a probe input signal by sampling the input signal using the sampling clock and outputs the generated probe input signal outside the electronic device.

5. The probe circuit according to claim 4, further comprising:
a timing difference calculating section that outputs, outside the electronic device, information indicating a timing difference between an edge timing of the probe output signal and an edge timing of the probe input signal.

6. The probe circuit according to claim 3, further comprising:
a counter circuit that outputs a temporal signal indicating a length of time elapsed since a prescribed reference time; and
a storage section that stores a signal output by the counter circuit in accordance with the edge timing signal.

7. A multi-probe circuit, comprising:
a plurality of the probe circuits according to claim 3, each of the plurality of the probe circuits being supplied with a same reference clock that operates the sampling clock supplying section; and
an edge timing output section that outputs a logical disjunction signal of the edge timing signals detected by the plurality of the probe circuits.

8. The multi-probe circuit according to claim 7, wherein
the edge-timing output section outputs the logical disjunction signal together with information indicating whether a rising edge or a trailing edge of the edge timing signal is detected by each of the plurality of the probe circuits.

9. The multi-probe circuit according to claim 7, wherein
the edge-timing output section outputs the logical disjunction signal together with information indicating which of the plurality of the probe circuits detects the edge timing signal.

10. The multi-probe circuit according to claim 7, wherein
the plurality of the probe circuits are provided corresponding to a plurality of nodes in the circuit under test, and each of the plurality of the probe circuits samples the response signal output from the corresponding node.

11. The probe circuit according to claim 1, wherein
the edge timing detecting section includes:
more than two flip-flops that are cascade-connected to each other and latch the response signal with the sampling clock;
a selecting circuit that selects two of output signals output by the more than two flip-flops; and an exclusive-OR circuit that calculates exclusive disjunction of the selected output signals to generate an edge timing signal that indicates the edge timing.

12. The probe circuit according to claim 11, wherein the edge-timing detecting section further includes a control circuit that determines which output signal is selected by the selecting circuit depending, on a number of pulses of the sampling clock included in the recurrence period.

13. A test apparatus that tests an electronic device including the probe circuit according to claim 1, comprising:
an operation-clock generating section that supplies the operation clock to the circuit under test; and
a reference-clock generating section that generates of reference clock for the sampling clock based on the operation clock, the reference-clock generating section supplying the generated operation clock to the sampling clock supplying section.

14. The test apparatus according to claim 13, wherein the probe output signal sampled at each pulse of the sampling clock is arranged in a prescribed sequence and compared with a predetermined signal pattern.

15. The test apparatus according to claim 13, wherein
the electronic device includes a plurality of the probe circuits,
each of the plurality of the probe circuits further includes an edge-timing signal generating section that generates an edge-timing signal corresponding to an edge timing at which a logical value of the probe output signal changes, and
the electronic device further includes an edge-timing output section that outputs the edge timing signal together with information indicating which of the plurality of the probe circuits generates the edge timing signal each of which is generated by one of the plurality of the probe circuits, wherein the test apparatus determines which of the plurality of the probe circuits generates the edge-tuning signal based on the information output together with the edge timing signal.

16. A test apparatus that tests an electronic device including a probe circuit and a circuit under test that outputs a response signal corresponding to an input signal in synchronization with an operation clock, the probe circuit including a sampling clock supplying section that outputs a sampling clock having a predetermined frequency, a sampling section that outputs, outside the electronic device, a probe output signal of which frequency is lower than as frequency of the response signal and which corresponds to a sampling result obtained by sampling the response signal using the sampling clock, and an input signal sampling section that generates a probe input signal by sampling the input signal using the sampling clock and outputs the probe input signal outside the electronic device, wherein the response signal has a prescribed signal pattern repeated with a predetermined recurrence period, and the sampling clock supplying section outputs the sampling clock of which relative phase with respect to the signal pattern sequentially changes in each recurrence period, the test apparatus comprising:
an operation-clock generating section that supplies the operation clock to the circuit under test;
a reference-clock generating section that generates a reference clock for the sampling clock based on the operation clock, the reference-clock generating section supplying the generated operation clock to the sampling clock supplying section; and
a timing difference measuring section that measures a timing difference between an edge timing of the probe output signal and an edge timing of the probe input signal based en the probe output signal and the probe input signal.

17. The test apparatus according to claim 16, wherein the probe output signal sampled at each pulse of the sampling, clock is arranged in to prescribed sequence and compared with a predetermined signal pattern.

18. The test apparatus according to claim 16, wherein
the electronic device includes a plurality of the probe circuits,
each of the plurality of the probe circuits further includes an edge-timing signal generating section that generates an edge-timing signal corresponding to an edge timing at which a logical value of the probe output signal changes, and
the electronic device further includes an edge-timing output section that outputs the edge timing signal together with information indicating which of the plurality of the probe circuits generates the edge timing signal each of which is generated by one of the plurality of the probe circuits, wherein the test apparatus determines which of the plurality of the probe circuits generates the edge-timing signal based on the information output together with the edge timing signal.

19. An electronic device, comprising:
a circuit that is under test and outputs a response signal corresponding to an input signal in synchronization with an operation clock; and
a probe circuit that includes:
sampling clock supplying section that outputs a sampling dock having a predetermined frequency;
a sampling section that outputs, outside the electronic device, a probe output signal of which frequency is lower than a frequency of the response signal and which corresponds to a sampling result obtained by sampling the response signal using the sampling clock; and
an edge-tinting detecting section that detects edge timing at which a logical value of the probe output signal changes,
wherein the response signal has a prescribed signal pattern repeated with a predetermined recurrence period, and
the sampling clock supplying section outputs the sampling clock of which relative phase with respect to the signal pattern sequentially changes in each recurrence period.

* * * * *